United States Patent
Keith et al.

(10) Patent No.: US 9,281,458 B2
(45) Date of Patent: Mar. 8, 2016

(54) OPTOELECTRONIC SEMICONDUCTOR COMPONENT AND METHOD FOR THE PRODUCTION THEREOF

(75) Inventors: Christina Keith, Neutraubling (DE); Bert Braune, Wenzenbach (DE); Michael Kruppa, Geisenfeld (DE)

(73) Assignee: OSRAM Opto Semiconductors GmbH (DE)

(*) Notice: Subject to any disclaimer, the term of this patent is extended or adjusted under 35 U.S.C. 154(b) by 3 days.

(21) Appl. No.: 14/127,049

(22) PCT Filed: Jun. 20, 2012

(86) PCT No.: PCT/EP2012/061872
§ 371 (c)(1),
(2), (4) Date: Mar. 11, 2014

(87) PCT Pub. No.: WO2012/175569
PCT Pub. Date: Dec. 27, 2012

(65) Prior Publication Data
US 2014/0217444 A1    Aug. 7, 2014

(30) Foreign Application Priority Data
Jun. 20, 2011    (DE) .................. 10 2011 105 010

(51) Int. Cl.
*H01L 29/49* (2006.01)
*H01L 33/56* (2010.01)
*H01L 33/60* (2010.01)

(52) U.S. Cl.
CPC ............ *H01L 33/56* (2013.01); *H01L 33/60* (2013.01); *H01L 2224/48091* (2013.01); *H01L 2224/73265* (2013.01)

(58) Field of Classification Search
CPC ...................... H01L 22/56; H01L 33/60
See application file for complete search history.

(56) References Cited

U.S. PATENT DOCUMENTS

| | | | |
|---|---|---|---|
| 6,610,563 B1* | 8/2003 | Waitl et al. | 438/166 |
| 7,001,972 B1* | 2/2006 | Tillack et al. | 528/45 |
| 7,586,190 B2* | 9/2009 | Bogner et al. | 257/717 |
| 7,815,343 B2* | 10/2010 | Nii et al. | 362/311.03 |
| 8,735,920 B2* | 5/2014 | Ibbetson et al. | 257/98 |
| 8,853,732 B2* | 10/2014 | Muller et al. | 257/99 |
| 8,860,062 B2* | 10/2014 | Schneider et al. | 257/98 |
| 2001/0033722 A1* | 10/2001 | Okada et al. | 385/94 |
| 2002/0057057 A1* | 5/2002 | Sorg | 313/512 |
| 2005/0253130 A1* | 11/2005 | Tsutsumi et al. | 257/13 |
| 2005/0285494 A1* | 12/2005 | Cho et al. | 313/112 |
| 2006/0091788 A1 | 5/2006 | Yan | |
| 2006/0138441 A1* | 6/2006 | Kromotis et al. | 257/99 |

(Continued)

FOREIGN PATENT DOCUMENTS

| | | |
|---|---|---|
| WO | 2006/006544 | 1/2006 |
| WO | 2010/145893 | 12/2010 |

*Primary Examiner* — Michael Shingleton
(74) *Attorney, Agent, or Firm* — DLA Piper LLP (US)

(57) ABSTRACT

An optoelectronic semiconductor device including a carrier substrate and at least one semiconductor chip arranged thereon, wherein the semiconductor chip includes an active layer that generates radiation, conductor tracks electrically contacting the semiconductor chip arranged on the carrier substrate, the semiconductor chip is enclosed in a potting material, and the potting material includes at least a first potting layer, a second potting layer and a third potting layer, which differ from one another in at least one of: their material composition, their optical properties and their chemical properties.

13 Claims, 1 Drawing Sheet

(56) References Cited

U.S. PATENT DOCUMENTS

| | | |
|---|---|---|
| 2008/0173889 A1* | 7/2008 | Shylo et al. .................... 257/98 |
| 2008/0218072 A1* | 9/2008 | Haruna et al. ................ 313/506 |
| 2008/0231181 A1 | 9/2008 | Pang |
| 2009/0001390 A1* | 1/2009 | Yan et al. ........................ 257/89 |
| 2009/0256166 A1 | 10/2009 | Koike et al. |
| 2009/0267107 A1* | 10/2009 | Weber-Rabsilber et al. ... 257/99 |
| 2009/0278147 A1* | 11/2009 | Suzuki ............................ 257/98 |
| 2009/0321758 A1* | 12/2009 | Liu et al. ......................... 257/98 |
| 2010/0025709 A1* | 2/2010 | Koseki et al. ................... 257/98 |
| 2010/0065879 A1* | 3/2010 | Kirsch et al. ................... 257/99 |
| 2010/0140648 A1* | 6/2010 | Harada et al. .................. 257/98 |
| 2011/0062469 A1* | 3/2011 | Camras et al. ................. 257/98 |
| 2011/0198649 A1* | 8/2011 | Yamada .......................... 257/98 |
| 2012/0025218 A1* | 2/2012 | Ito et al. ......................... 257/88 |
| 2013/0140580 A1* | 6/2013 | Wirth et al. .................... 257/76 |
| 2013/0200411 A1* | 8/2013 | O'Brien et al. ................. 257/98 |
| 2013/0207145 A1* | 8/2013 | Schneider et al. ............. 257/98 |
| 2014/0175478 A1* | 6/2014 | Wirth .............................. 257/98 |
| 2014/0217444 A1* | 8/2014 | Keith et al. ..................... 257/98 |

* cited by examiner

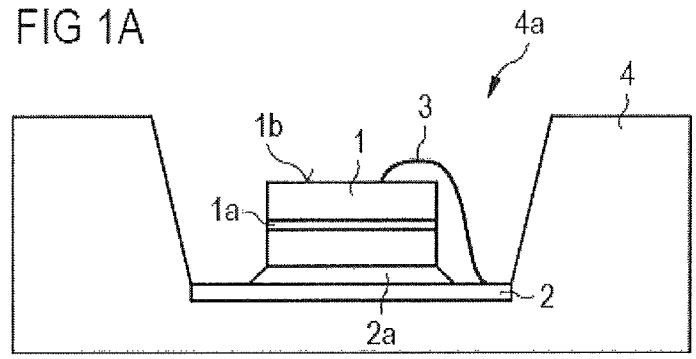
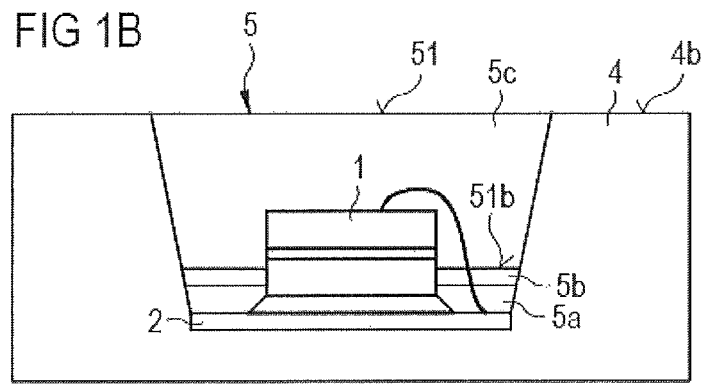
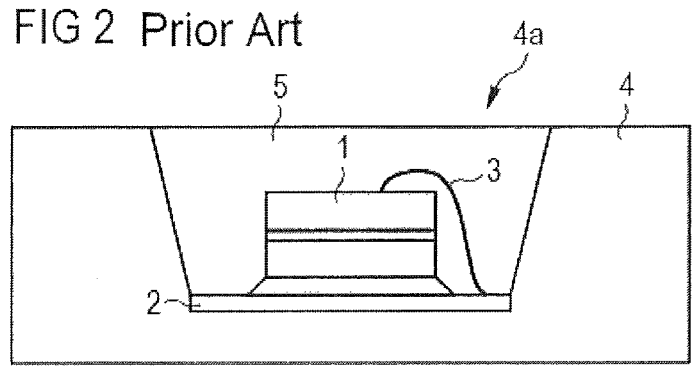

OPTOELECTRONIC SEMICONDUCTOR COMPONENT AND METHOD FOR THE PRODUCTION THEREOF

TECHNICAL FIELD

This disclosure relates to an optoelectronic semiconductor device with a carrier substrate and a semiconductor chip applied thereto, as well as a method of producing such a semiconductor device.

BACKGROUND

Semiconductor devices comprising a carrier substrate and a semiconductor chip applied thereto often additionally comprise a potting material which encloses the semiconductor chip. Known potting materials include silicone or epoxide. However, silicone is disadvantageously gas permeable such that gas arising in the environment surrounding the semiconductor device may pass through the potting material to the carrier substrate and may for example reach the conductor tracks applied thereto. This may lead disadvantageously to corrosion of the conductor tracks.

The potting material epoxide, on the other hand, exhibits good gas-tightness such that penetration of the epoxide potting material by harmful gases may be prevented. However, epoxide is disadvantageously not light-stable. In particular, a potting material of epoxide may experience yellowing and/or a cracking due to irradiation of the potting material with UV light.

It could therefore be helpful to provide a semiconductor device which avoids the above-stated disadvantages, resulting advantageously in an ageing-resistant semiconductor device in particular comprising a potting material which is distinguished by improved gas-tightness and at the same time by improved light-stability. It could also be helpful to provide a method of producing a semiconductor device improved in this way.

SUMMARY

We provide an optoelectronic semiconductor device which includes a carrier substrate and at least one semiconductor chip arranged thereon, wherein the semiconductor chip comprises an active layer that generates radiation, conductor tracks electrically contacting the semiconductor chip arranged on the carrier substrate, the semiconductor chip is enclosed in a potting material, and the potting material comprises at least a first potting layer, a second potting layer and a third potting layer, which differ from one another in at least one of their material composition, their optical properties and their chemical properties.

We also provide a method of producing a semiconductor device including providing a carrier substrate with conductor tracks applied thereto, applying a semiconductor chip to the carrier substrate and electrically contacting it, applying a first potting layer to the carrier substrate, which layer at least partially surrounds the semiconductor chip, applying a second potting layer to the first potting layer, which layer at least partially surrounds the semiconductor chip, and applying a third potting layer to the second potting layer, which layer at least partially surrounds the semiconductor chip, wherein the first potting layer, the second potting layer and the third potting layer differ from one another in at least one of their material composition, their optical properties and their chemical properties.

We further provide an optoelectronic semiconductor device including a carrier substrate and at least one semiconductor chip arranged thereon, wherein the semiconductor chip comprises an active layer suitable for generating radiation, conductor tracks for electrical contacting of the semiconductor chip are arranged on the carrier substrate, the semiconductor chip is enclosed in a potting material, the potting material comprises at least a first potting layer, a second potting layer and a third potting layer, which differ from one another in at least one of: their material composition, their optical properties and their chemical properties, and the first potting layer facing the carrier substrate is an epoxide layer and is formed as a gas barrier.

BRIEF DESCRIPTION OF THE DRAWINGS

FIGS. 1A and 1B each show a schematic cross section of an example of a semiconductor device in the process of being produced.

FIG. 2 shows a schematic cross section of a semiconductor device according to the prior art.

DETAILED DESCRIPTION

Our optoelectronic semiconductor device may comprise a carrier substrate and at least one semiconductor chip arranged thereon. The semiconductor chip may comprise an active layer that generates radiation. Conductor tracks are arranged on the carrier substrate for electrical contacting of the semiconductor chip. The semiconductor chip is enclosed in a potting material which comprises at least a first, a second and a third potting layer. The potting layers of the potting material differ from one another in their material composition and/or in their optical and/or chemical properties. The conductor tracks may, for example, comprise a body or a layer formed with a metal with a tendency to corrode such as silver. The carrier substrate may, for example, take the form of a lead frame which consists of the metal or comprises a layer of the metal.

The potting material is thus composed of different potting layers the materials of which are selected in accordance with the desired properties. This results advantageously in the possibility of producing a potting material displaying a plurality of desired properties which is conventionally impossible with a one-piece potting material due to the limited material selection. Use of such triple layer potting, for example, combines the advantages of the gas-tightness of epoxide potting and the light-stability of silicone potting.

The conductor tracks of the carrier substrate generally comprise silver. However, silver is prone to silver corrosion caused by sulfur-containing compounds and harmful gases which may pass through a silicone potting material. As a result of the triple layer potting which allows the selection of different materials with very varied material properties, corrosion of the silver conductor tracks may advantageously be avoided through one of the layers of the potting material displaying gas-tightness.

The layers of the potting material, for example, comprise a different matrix material such as silicone or epoxide, for example. In addition or alternatively, the layers may differ in the particles or pigments introduced into the matrix material. For example, one of the potting material layers comprises an additional pigment, while the other potting material layers do not contain any such pigments.

The semiconductor device is an optoelectronic semiconductor device which allows the conversion of electronically generated data or energy into light emission or vice versa. The optoelectronic semiconductor device, for example, comprises a semiconductor chip, preferably a radiation-emitting semiconductor chip, for example, an LED.

The active layer of the semiconductor chip preferably contains a pn-junction, a double heterostructure, a single quantum well structure (SQW) or a multi quantum well structure (MQW) for radiation generation. The term quantum well structure does not here have any meaning with regard to the dimensionality of the quantization. It encompasses inter alia quantum troughs, quantum wires and quantum dots and any combination of these structures.

The semiconductor chip preferably comprises a semiconductor layer sequence of semiconductor material. In particular, the semiconductor chip, especially the active layer, preferably contains a III/V semiconductor material. III/V semiconductor materials are particularly suitable to generate radiation in the ultraviolet through the visible to the infrared spectral range. The semiconductor chip comprises a plurality of semiconductor layers deposited epitaxially on one another in which the active layer is arranged. The layers of the semiconductor chip were, for example, grown on a growth substrate which was then at least partially or completely detached.

The potting layers of the potting material may be arranged one above the other in the vertical direction. The vertical direction is, for example, directed perpendicular to a mounting surface of the semiconductor chip. The mounting surface is preferably a flat bottom surface of a cavity of the housing. Preferably, the vertical direction is a main emission direction of the optoelectronic semiconductor device. The potting material accordingly comprises a stack of different potting layers. In the vertical direction, the individual potting layers each have a height which may be adapted to the desired properties.

The semiconductor chip is preferably arranged on the carrier substrate. The semiconductor chip is fastened to the carrier substrate, for example, by a bonding layer. The bonding layer is preferably an adhesive layer.

The first potting layer is, for example, arranged directly on the carrier substrate and at least partially surrounds the semiconductor chip. The semiconductor chip is accordingly arranged in the first potting layer, the semiconductor chip being of a height greater than the height of the first potting layer. The second potting layer may be arranged directly on the first potting layer and likewise at least partially surround the semiconductor chip. The combined height of the first potting layer and the second potting layer may here be less than the height of the semiconductor chip such that the semiconductor chip projects vertically beyond the first potting layer and the second potting layer. Alternatively or in addition, the second potting layer preferably comprises a major face on the side remote from the carrier substrate. The distance in the vertical direction between the major face and the carrier substrate is preferably less than the distance between the active layer of the semiconductor chip and the carrier substrate.

The third potting layer may be arranged on the second potting layer and finally enclose the semiconductor chip. The second potting layer is accordingly arranged between the first and third potting layers. The combined height of the first potting layer, the second potting layer and the third potting layer accordingly projects beyond the height of the semiconductor chip such that the semiconductor chip is completely enclosed by the first potting layer, the second potting layer and the third potting layer.

The first potting layer facing the carrier substrate may take the form of a gas barrier. This may result in a potting material which is gas-tight at least in places. The first potting layer here directly adjoins the carrier substrate. The first potting layer in this way advantageously protects the conductor tracks of the carrier substrate from corrosion.

The first potting layer thus advantageously prevents the diffusion and penetration of gases arising in the surrounding environment to the conductor tracks of the carrier substrate. The first potting layer preferably has a gas-impermeability for harmful gases of over 80%, preferably of over 90%, particularly preferably of over 95%.

The first potting layer may be an epoxide layer. An epoxide layer is distinguished by particularly good gas-tightness, but has low light-stability. By forming a first potting layer of epoxide on the carrier substrate, wherein the first potting layer is followed by a second and a third potting layer, the advantage of such epoxide layer may be greatly used. At the same time, the epoxide layer is not exposed to the radiation exit side of the semiconductor chip since this is arranged solely at side faces of the semiconductor chip so that yellowing or cracking of the epoxide layer may be avoided.

Pigments which increase the reflectivity of the second potting layer may be contained in the second potting layer, which is arranged on the side of the first potting layer remote from the carrier substrate. The height of the first potting layer and the height of the second potting layer are preferably configured such that the major face of the second potting layer remote from the carrier substrate is located between the carrier substrate and the active layer of the semiconductor chip. Such an arrangement advantageously reflects the electromagnetic radiation generated by the active layer towards a radiation exit side of the semiconductor chip and thus increases the degree of outcoupling of the radiation generated. Through the increased reflectivity of the second potting layer, the epoxide layer therebeneath may advantageously be protected from light-dependent yellowing and cracking. In particular, the second potting layer protects the first potting layer from degradation which may, for example, arise as a result of back-reflected radiation.

The second potting layer advantageously has a reflectivity of 60% for radiation in the visible wavelength range, preferably of 80%, more preferably of 90%.

The pigments may be white pigments. White pigments introduced in this way are particularly advantageous to increase reflectivity.

The second potting layer may be a silicone layer. A silicone layer is distinguished in particular by light-stability for radiation in the UV and visible wavelength ranges. Gases passing through the silicone layer may be prevented by the first potting layer of epoxide from reaching the carrier substrate and the conductor tracks applied thereto, thereby permitting satisfactory protection from corrosion.

The third potting layer, which may be arranged on the side of the second potting layer remote from the first potting layer, may comprise a highly transparent, light-stable material. In particular, the third potting layer may be arranged downstream of a radiation exit side of the semiconductor chip such that the third potting layer couples the radiation generated in the semiconductor chip out of the semiconductor device. Due to the highly transparent and light-stable material of the third potting layer, efficient light outcoupling out of the device and an ageing-resistant device may be achieved. The third potting layer here covers the semiconductor chip against the surrounding environment.

"Highly transparent" means that the material of the third potting layer is preferably 80%, more preferably 90%, particularly preferably 95% radiation-transmissive for radiation in the UV or visible spectral ranges.

"Light-stable" means that the material of the third potting layer displays no or barely any yellowing effects or cracking effects when irradiated with UV light for a given period. The material of the third potting layer is preferably UV-stable.

The third potting layer may be a silicone layer. The third potting layer, for example, comprises a transparent potting material in which preferably no pigments or particles are contained.

The semiconductor device may comprise a housing with a cavity in which the semiconductor chip is arranged, the potting material being introduced into the cavity, thereby surrounding the semiconductor chip.

The housing in this case surrounds the carrier substrate, for example, at least in places such that a bottom surface of the cavity is formed by the carrier substrate or by the conductor tracks of the carrier substrate.

The carrier substrate is preferably a metal carrier, for example, a lead frame consisting, for example, of a copper substrate with at least one noble metal layer which may, for example, take the form of silver. It is additionally possible for the carrier substrate to be a circuit board, for example, a printed circuit board (PCB).

The potting material preferably completely surrounds the semiconductor chip. The potting material preferably completely fills the cavity of the housing such that a surface of the housing is coplanar with a surface of the potting material.

Our method of producing a semiconductor device may comprise the following method steps:
providing a carrier substrate with conductor tracks applied thereto;
applying a semiconductor chip to the carrier substrate and electrically contacting it;
applying a first potting layer to the carrier substrate, which layer at least partially surrounds the semiconductor chip;
applying a second potting layer to the first potting layer, which layer at least partially surrounds the semiconductor chip; and
applying a third potting layer to the second potting layer, which layer at least partially surrounds the semiconductor chip, wherein the first potting layer, the second potting layer and the third potting layer differ from one another in their material composition and/or in their optical and/or chemical properties.

The features and advantages mentioned in relation to the semiconductor device also apply in relation to the production method and vice versa.

A semiconductor device produced in this way is distinguished by triple potting material which combines the advantages of epoxide potting with the advantages of silicone potting. In this way, it is in particular possible to achieve a potting material distinguished by suitable gas-tightness and light-stability. To this end, a semiconductor chip is surrounded successively by the different materials of the individual potting layers. The various materials are applied to one another in succession in the vertical direction.

The semiconductor device may comprise a housing with a cavity, wherein the semiconductor chip and the potting layers are introduced into the cavity. The potting material then preferably completely surrounds the semiconductor chip and closes the housing cavity in planar manner.

Further advantages are revealed by the examples described below in conjunction with FIGS. 1 and 2.

In the figures, identical or identically acting elements may in each case be provided with the same reference numerals. The elements illustrated and their size ratios to one another should not be regarded as being to scale. Rather, individual elements such as, for example, layers, structures, components and regions are shown exaggeratedly thick or large for greater ease of depiction and/or better comprehension.

FIG. 2 shows a cross section of a known semiconductor device comprising a semiconductor chip 1 in a housing 4. The housing 4 in particular comprises a cavity 4a in which the semiconductor chip 1 is arranged. A base surface of the cavity 4a is formed by a carrier substrate 2 on which conductor tracks are arranged for electrical contacting of the semiconductor chip 1.

For electrical contacting of the semiconductor chip 1, the semiconductor chip 1 is fastened, for example, by a bonding layer, for example, an adhesive or a solder layer to one of the conductor tracks of the carrier substrate 2. A second conductor track insulated electrically from the conductor track is arranged on the carrier substrate 2, wherein a top terminal area of the semiconductor chip 1 is connected electrically conductively to the further conductor track by a bonding wire 3.

The cavity 4a in the housing 4 comprises inclined side faces which serve to reflect radiation emitted by the semiconductor chip 1. The semiconductor chip 1 comprises an active layer for generating radiation.

The semiconductor chip 1 is enclosed in a potting material 5 which has been introduced into the cavity 4a in the housing 4. A potting material used conventionally to enclose the semiconductor chip 1 comprises silicone or epoxide, for example. Silicone is distinguished by particularly good light-stability and is accordingly insensitive to degradation by, for example, UV radiation. However, silicone is disadvantageously gas-permeable such that harmful gases or sulfur-containing compounds from the environment surrounding the semiconductor device may diffuse through the silicone and thus penetrate as far as the carrier substrate and the conductor tracks arranged thereon. This may disadvantageously lead to corrosion of the conductor tracks of the carrier substrate.

Examples of harmful gases or harmful compounds which may here diffuse through the potting material of silicone to the conductor tracks of the carrier substrate are $NO_x$, $H_2O$ or $H_2S$. In this case, with silver-containing conductor tracks $Ag_2S$ may arise as a corrosion product, resulting in disadvantageous darkening of the conductor tracks. In addition, the conductor tracks may in this way become sensitive to mechanical influences, making them fragile, which has a negative effect on the service life of such devices.

Although epoxide, when used as a potting material, is gas-tight, it disadvantageously displays degradation effects on irradiation with UV light, for example. Irradiation of an epoxide potting material, in particular, results in yellowing of the potting material and/or a cracking in the potting material, which disadvantageously reduces the service life of such semiconductor devices.

To combat this disadvantage of conventionally used potting materials, the semiconductor chip is enclosed in a potting material which comprises a first, a second and a third potting layer. Such a production process and such a semiconductor device are described in relation to FIGS. 1A and 1B.

FIG. 1A shows a semiconductor device in the process of being produced. In a housing 4 comprising a cavity 4a, a semiconductor chip 1 is arranged on a carrier substrate 2. The carrier substrate forms the bottom surface of the cavity 4a. On a surface facing the semiconductor chip, the carrier substrate 2 comprises conductor tracks that electrically contact the semiconductor chip 1. The semiconductor chip 1 is fastened by its bottom to one of the conductor tracks by a solder layer 2a. At the top, the semiconductor chip 1 electrically conductively connects to a further conductor track of the carrier substrate 2 by a bonding wire 3.

The semiconductor chip 1 comprises a radiation exit side 1b from which the majority of the radiation generated in an active layer 1a of the semiconductor chip 1 exits. The side faces of the cavity 4a are inclined such that laterally emitted radiation is reflected at these side faces towards the outcoupling side of the device.

The carrier substrate 2 is incorporated into the housing 4. In particular, the carrier substrate 2 is surrounded by the material of the housing 4, wherein a top, on which the semiconductor chip is applied, is at least partially free of housing material. The semiconductor chip 1 is electrically contacted via the carrier substrate or the conductor tracks of the carrier substrate.

To this end, the carrier substrate 2 is, for example, electrically contactable from outside, for example, by vias through the material of the housing 4 (not shown). Alternatively, the carrier substrate 2 and/or the conductor tracks of the carrier substrate 2 may project laterally through the housing 4 to allow external electrical contacting (not shown). Such methods of contacting the carrier substrate or the conductor tracks of the carrier substrate from outside are known and are not therefore described in any greater detail here.

The carrier substrate 2 is, for example, a circuit board or a "lead frame". The conductor tracks of the carrier substrate 2 preferably comprise silver or a silver alloy.

In the next method step, the semiconductor chip 1 is potted using a potting material. To this end, as illustrated in FIG. 1B, a first potting layer is introduced directly into the cavity 4a of the housing 4. Since the semiconductor chip 1 has already been applied to the carrier substrate 2, the first potting layer 5a is applied directly to the carrier substrate 2 to the side of the semiconductor chip. The first potting layer 5a then encloses the semiconductor chip 1 in the lateral direction. The first potting layer 5a is preferably thin such that the majority of the semiconductor chip 1 projects beyond the first potting layer 5a in the vertical direction.

The first potting layer 5a is preferably an epoxide layer which is distinguished by particularly good gas-impermeability. This prevents diffusion of gases to the surface of the conductor track of the carrier substrate 2. The first potting layer 5a accordingly forms a gas barrier which prevents penetration of harmful gases or sulfur-containing compounds to the carrier substrate and to the conductor tracks. This advantageously makes it possible to prevent corrosion, for example, silver corrosion in the case of silver-containing conductor tracks.

Next, a second potting layer 5b is applied to the first potting layer 5a. The second potting layer is likewise thin such that the majority of the semiconductor chip 1 projects beyond the second potting layer 5b in the vertical direction. Preferably, the combined height of the first potting layer 5a and second potting layer 5b is less than the height of the semiconductor chip 1, preferably less than half the height of the semiconductor chip 1. The active layer 1a is preferably not surrounded by the first and second potting layers 5a, 5b. The second potting layer 5b preferably comprises a major face 51b on the side remote from the carrier substrate 2. The distance in the vertical direction between the major face 51b and the carrier substrate 2 is preferably less than the distance between the active layer 1a of the semiconductor chip and the carrier substrate 2. In other words, the major face 51b of the second potting layer is located between the carrier substrate 2 and the active layer 1a of the semiconductor chip 2.

The second potting layer is, for example, a silicone layer, which preferably contains a white pigment.

Reflectivity of the second potting layer may be increased advantageously by this white pigment, whereby the epoxide layer arranged beneath it may be protected from incident light radiation and thus from light-related yellowing. In particular, the epoxide layer beneath may be protected from degradation.

A third potting layer 5c which completely encloses the top of the semiconductor chip 1 is applied to the second potting layer 5b. In particular, the third potting layer 5c completely fills the cavity of the housing such that a surface 4b of the housing and a surface 51 of the third potting layer 5c form a plane surface. In this way, the third potting layer 5c projects completely beyond the semiconductor chip 1 in the vertical direction and is in particular applied directly over the radiation exit side of the semiconductor chip 1.

The third potting layer 5c is preferably a silicone layer formed of a highly transparent, light-stable material. This results in effective light outcoupling of the radiation generated in the active layer of the semiconductor chip 1. The third potting layer 5c is in particular a transparent potting material of silicone which covers the semiconductor chip 1 against the surrounding environment.

The potting material of the example of FIG. 1B is thus composed of three potting layers 5a, 5b, 5c are arranged vertically one above the other. The potting layers of the potting material are in this case configured so as to ensure desired properties in certain regions. For instance, a potting material is made possible which is gas-impermeable due to the bottom epoxide layer and allows efficient light outcoupling due to the silicone layers arranged thereover. The middle silicone layer then protects the bottom epoxide layer from degradation such that overall an ageing-resistant, radiation-efficient and potted device may be produced.

Our components and methods are not limited to the examples as a result of the description made with reference thereto, but instead this disclosure encompasses any novel feature and any combination of features, including in particular any combination of features in the appended claims, even if the features or the combinations are not themselves explicitly indicated in the claims or examples.

The invention claimed is:

1. An optoelectronic semiconductor device comprising a carrier substrate and at least one semiconductor chip arranged thereon, wherein:
    the semiconductor chip comprises an active layer that generates radiation;
    conductor tracks electrically contacting the semiconductor chip arranged on the carrier substrate;
    the semiconductor chip is enclosed in a potting material; and
    the potting material comprises at least a first potting layer, a second potting layer and a third potting layer, which differ from one another in at least one of: their material composition, their optical properties and their chemical properties,
    the second potting layer contains pigments that increase reflectivity of the second potting layer;
    the second potting layer is arranged on a side of the first potting layer remote from the carrier substrate; and
    the second potting layer is arranged between the carrier substrate and the active layer of the semiconductor chip.

2. The semiconductor device according to claim 1, wherein the potting layers of the potting material are arranged one above the other in a vertical direction.

3. The semiconductor device according to claim 1, wherein the second potting layer is arranged between the first potting layer and third potting layer.

4. The semiconductor device according to claim 1, wherein the first potting layer facing the carrier substrate is formed as a gas barrier.

5. The semiconductor device according to claim 4, wherein the first potting layer is an epoxide layer.

6. The semiconductor device according to claim 1, wherein the pigments are white pigments.

7. The semiconductor device according to claim 1, wherein the second potting layer is a silicone layer.

8. The semiconductor device according to claim 1, wherein the second potting layer comprises a major face on a side of the second potting layer remote from the carrier substrate, said major face being located between the carrier substrate and the active layer of the semiconductor chip.

9. The semiconductor device according to claim 1, wherein the third potting layer is arranged on a side of the second potting layer remote from the first potting layer and comprises a highly transparent and light-stable material.

10. The semiconductor device according to claim 9, wherein the third potting layer is a silicone layer.

11. The semiconductor device according to claim 1, comprising a housing with a cavity in which the semiconductor chip is arranged, wherein the potting material is introduced into the cavity and encloses the semiconductor chip.

12. An optoelectronic semiconductor device comprising a carrier substrate and at least one semiconductor chip arranged thereon, wherein:

the semiconductor chip comprises an active layer that generates radiation;

conductor tracks for electrical contacting of the semiconductor chip are arranged on the carrier substrate;

the semiconductor chip is enclosed in a potting material;

the potting material comprises at least a first potting layer, a second potting layer and a third potting layer, which differ from one another in at least one of: their material composition, their optical properties and their chemical properties;

the first potting layer facing the carrier substrate is an epoxide layer and is formed as a gas barrier;

the first, second and third potting layers are arranged one above the other in a vertical direction, wherein the second potting layer is arranged between the first potting layer and the third potting layer, the semiconductor chip has a height larger than a height of the first potting layer; and the third potting layer is applied directly on a radiation exit side of the semiconductor chip.

13. The optoelectronic semiconductor device according to claim 12, wherein the second potting layer is arranged on a side of the first potting layer remote from the carrier substrate and contains pigments which increase reflectivity of the second potting layer.

* * * * *